United States Patent [19]

Orikabe et al.

[11] 4,333,164
[45] Jun. 1, 1982

[54] READ ONLY MEMORY

[75] Inventors: Yasuo Orikabe, Kawasaki; Masakazu Matsuda, Ishikawa, both of Japan

[73] Assignee: Fujitsu Limited, Kawasaki, Japan

[21] Appl. No.: 124,466

[22] Filed: Feb. 25, 1980

[30] Foreign Application Priority Data

Feb. 28, 1979 [JP] Japan .................. 54-23084

[51] Int. Cl.³ .............................................. G11C 17/00
[52] U.S. Cl. ..................................... 365/104; 365/178
[58] Field of Search ................... 365/104, 178; 357/45

[56] References Cited

U.S. PATENT DOCUMENTS 4,059,826 11/1977 Rogers ................................ 365/104
4,230,504 10/1980 Kuo ...................................... 357/45

*Primary Examiner*—James W. Moffitt

[57] ABSTRACT

A read only memory (ROM) comprising word lines, bit lines, virtual ground lines and memory cells of FETs arranged on intersections of the word lines and bit lines. A gate of each cell is connected to one of the word lines. A drain of each cell is connected to one of the bit lines. A source of each cell is connected to one of the virtual ground lines. According to the invention, the particular cells storing information "0" are depletion-type transistors, the threshold voltage of which being lowered by ion implantation. When the ROM is in operation with respect to the memory cells on a selected bit line, the potential difference between a selected word line and a selected virtual ground line is enough to turn on the depletion-type cell but not enough to turn on the other cells, and the potential difference between a non-selected word line and the selected virtual ground line is not enough to turn on the depletion-type cell.

19 Claims, 7 Drawing Figures

(a)

(b)

(a)

(b)

READ ONLY MEMORY

BACKGROUND OF THE INVENTION

This invention relates to a read only memory (ROM), and more particularly to a mask ROM including depletion-type memory cells.

In general, a mask ROM includes a plurality of memory cells arranged in an array or matrix consisting of intersecting word lines and bit lines. Each of these memory cells can be fabricated as a field-effect transistor (FET) in a small area by using a metal-oxide-silicon (MOS) technique. Data is permanently stored in each cell during fabrication of the ROM.

Cross references in this field are as follows:
U.S. Pat. No. 4,080,718, "Method of Modifying Electrical Characteristics of MOS Devices Using Ion Implantation" issued on Mar. 28, 1978;
*Electronics*, Mar. 30, 1978, pp. 96–99, "Cell Layout Boots Speed of Low-Power 64-K ROM"; and
"A 100 ns 150 mW 64 K bit ROM", described in 1978 IEEE International Solid State Circuits Conference pp. 152–153, SESSION XII: HIGH DENSITY MEMORIES.

In an example of the prior-art devices, the construction of a ROM is such that the gate of each memory cell is connected to one of the word lines, the drain of each cell is connected to one of the bit lines, and a source of each cell is grounded. At a late stage of fabrication of the ROM, when an order for designing the ROM is received, in other words, when the data to be written into the ROM is determined, desired data is permanently stored in each memory cell in such a way that, when using N-channel transistors as memory cells, the particular cells into which information "1" is to be written are subjected to an ion implantation of P-type impurities. By the ion implantation, impurities of the same conducting type as the semiconductor body are injected into the selected channel regions to modify the threshold voltage of the selected cells to a high level. Thus, information "1" is stored in the selected particular cells.

The above-mentioned prior-art device has the advantage of a higher degree of integration in comparison with devices in which, for storing information "0", for example, areas for forming windows through an insulating layer are required to contact a bit line to a drain. Moreover, since data are written at a late stage of fabrication in accordance with the invention, the time between the determination of the write data and the shipping of the products is relatively short in comparison with well known devices in which, in order to write data, diffusion layers are cut at an early stage of fabrication.

However, the ROM obtained by modifying the threshold voltage of selected cells to a high level, as described above, has the following disadvantages. Since the conduction type of the implanted impurities is the same as that of the semiconductor body, the concentration of the impurities in the channel regions or near the channel regions where the impure ions have been implanted becomes high. This results in an increase in junction capacitances between the source and the semiconductor body and between the drain and the semiconductor body, in each selected memory cell. Therefore, the operating speed of the ROM is lowered, because a long time is required to read out data due to the increased capacitance. Moreover, since the depletion layer is narrowed due to the fact that the impurities are of the same conduction type as the semiconductor body, the breakdown voltages between the source and the semiconductor body and between the drain and the semiconductor body are lowered, and the amplitude of the voltage of each bit line is limited.

SUMMARY OF THE INVENTION

It is therefore an object of the present invention to provide a read only memory having a high operating speed and high junction breakdown voltages of the source and the drain, as well as having the advantages of a high degree of integration and short fabrication time, by implanting ions of conduction type opposite to that of the semiconductor substrate into the channel regions, so as to lower the threshold voltage of the implanted memory cells.

According to the present invention, there is provided a read only memory comprising: a plurality of word lines, a plurality of bit lines, a plurality of virtual ground lines, and a plurality of memory cells of field-effect transistors, each of the cells being provided at an intersection of the word lines and the bit lines, each of the cells having a first electrode, a second electrode, and a third electrode, the first electrode being connected to one of the word lines, the second electrode being connected to one of the bit lines, and the third electrode being connected to one of the virtual ground lines, and wherein channel regions of particular memory cells selected according to data to be stored in the read only memory are subjected to an ion implantation for forming depletion-type cells, whereby the word lines and the virtual ground lines are activated so that, with respect to the memory cells on a selected bit line, the potential difference between a selected word line and a selected virtual ground line is enough to turn on the depletion-type cell but not enough to turn on enhancement-type cells, and the potential difference between a nonselected word line and the selected virtual ground line is not enough to turn on the depletion-type cell.

DESCRIPTION OF THE PREFERRED EMBODIMENTS

Before describing the embodiments of the present invention, a known read only memory will first be explained.

Figure 1:
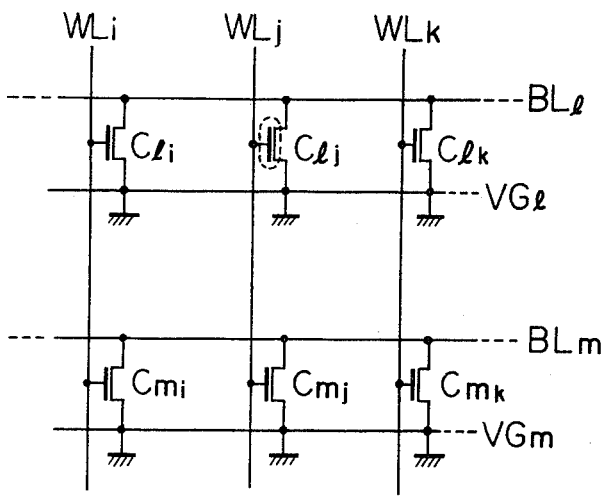
FIG. 1 is a circuit diagram of one form of a known read only memory.

FIG. 1 illustrates a known mask ROM. As shown in FIG. 1, the mask ROM comprises a plurality of memory cells Cli, Clj, Clk, Cmi, Cmj, Cmk, . . . . Each memory cell is a field-effect transistor of, for example, an N-channel type. These memory cells are arranged in a matrix consisting of intersecting word lines WLi, WLj, WLk, . . . and bit lines BLl, BLm, . . . . The gates of the cells Cli, Cmi, . . . are connected to the word line WLi. The gates of the cells Clj, Cmj, . . . are connected to the word line WLj. The gates of the cells, Clk, Cmk, . . . are connected to the word line WLk. The other gates (not shown) are each connected to a corresponding word line. The drains of the cells Cli, Clj, Clk, . . . are connected to the same bit line BLl. The drains of the cells Cmi, Cmj, Cmk, . . . are connected to the bit line BLm. The other gates (not shown) are each connected to a corresponding bit line. The sources of all the cells are directly grounded. For writing information "1" into desired memory cells, the desired cells have been subjected to an ion implantation. In FIG. 1, one of the desired cells Clj is shown with a dotted circle. The conduction type of the ions implanted into the channel regions of the desired cells is the same as that of the semiconductor substrate of the ROM. Therefore, in these N-channel FETs, the implanted ions are of P-type. The implantation of P-type ions into N-channel regions results in an increase in the threshold voltage of the selected cells. The other cells, which have been subjected to no ion implantation, represent the information "0".

Figure 2:
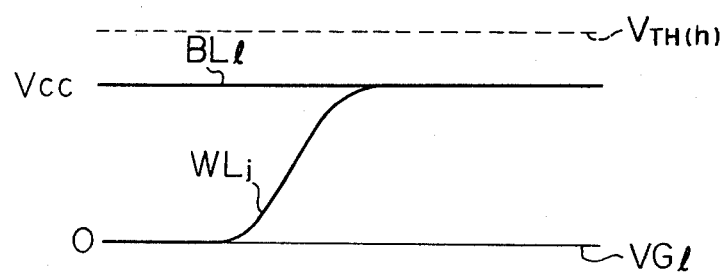
FIGS. 2 (*a*) and (*b*) are potential wave forms for explaining the operation of the circuit of FIG. 1.
Figure 2:
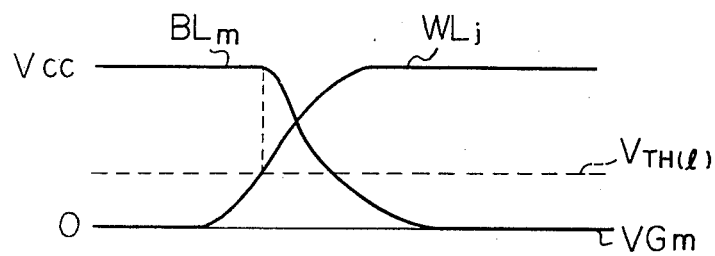

FIGS. 2 (a) and (b) are potential wave forms with respect to the cells Clj and Cmj respectively for explaining the operation of the circuit of FIG. 1.

During the reading out of data from the ROM of FIG. 1, all the bit lines BLl, BLm, . . . are connected to a power supply through a resistor (not shown) of a relatively large resistance. Therefore, all the bit lines are maintained at a high level (Vcc) before applying a voltage to any one of the word lines. Since the ion-implanted memory cell Clj has a threshold voltage $V_{TH(h)}$ higher than the Vcc level, the cell Clj will not be turned on even when a voltage of Vcc level is applied to the word line WLj as shown in FIG. 2 (a). Thus, the potential of the bit line BLl will be maintained at the high level Vcc. On the other hand, as shown in FIG. 2 (b), since the threshold voltage $V_{TH(l)}$ of the cell Cmj is not altered and is as low as, for example, about 1V, the cell Cmj will be turned on when the word-line potential reaches the threshold voltage $V_{TH(l)}$. Therefore, after the cell Cmj is turned on, the potential of the bit line BLm will gradually decrease from the Vcc level to the ground level. This gradual decrease is caused by the junction capacitance between the semiconductor body and the drain of each cell connected to the bit line BLm. Thus, the data stored in the ROM can be read out by detecting the change of the level on the bit lines using sense amplifiers (not shown) connected to the bit lines.

However, the ion implantation of the same conducting type as the semiconductor substrate causes the depletion layers beween the source and the semiconductor body and between the drain and the semiconductor body in the implanted cell to be narrowed. This results in, on the one hand, an increase in junction capacitances of the source and the drain so that the fall time of the bit lines is prolonged, thus increasing the access time to the ROM, and on the other hand, low junction breakdown voltages of the source and the drain, so that the amplitude of the bit-line voltage is limited.

Now, a ROM of an embodiment of the present invention will be hereinafter described in detail.

Figure 3:
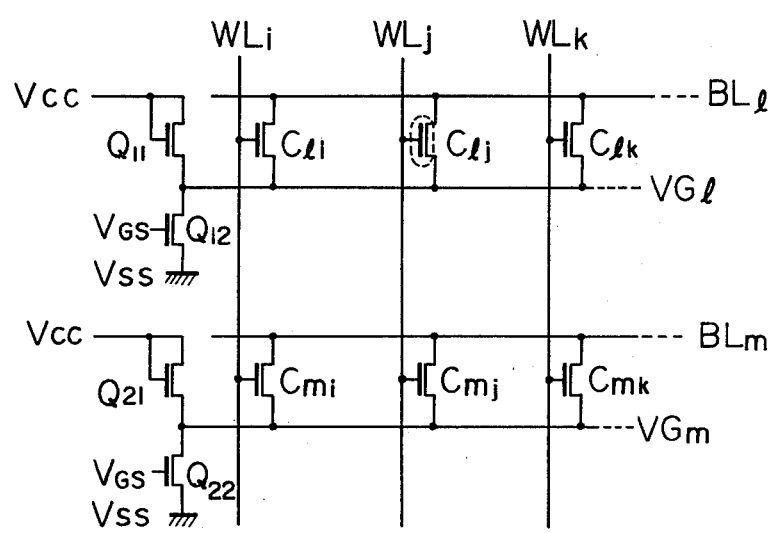
FIG. 3 is a circuit diagram of one embodiment of the present invention.

FIG. 3 illustrates a mask ROM of one embodiment of the invention. Referring to FIG. 3, the mask ROM of the present invention also comprises a plurality of memory cells Cli, Clj, Clk, Cmi, Cmj, Cmk, . . . . Each memory cell is also a field-effect transistor of an N-channel type in this embodiment of FIG. 3. Alternatively, P-channel transistors may of course be employed. These memory cells are also arranged in a matrix consisting of intersecting word lines WLi, WLj, WLk, . . . and bit lines BLl, BLm, . . . in almost the same way as the memory cells of the prior-art ROM described before are arranged. However, one difference is that, in this embodiment, the virtual ground lines VG'l, VG'm, . . . are not directly grounded, while the ground lines VGl, VGm, . . . in the prior art are directly grounded. The virtual ground line VG'l, to which the sources of the cells Cli, Clj, Clk, . . . in the bit line BLl are connected, is connected to the drain of a transistor Q12. The virtual ground line VG'm, to which the sources of the cells Cmi, Cmj, Cmk, . . . in the bit line BLm are connected, is connected to the drain of another transistor Q22. The drains of the transistors Q12 and Q22 are connected through transistors Q11 and Q21 respectively to a power supply Vcc of, for example, 5 volts. The transistors Q11 and Q21 may alternatively be other resistance means, e.g., resistors having an appropriate value. The sources of the transistors Q12 and Q22 are directly grounded. The other virtual ground lines not shown in FIG. 3 have the same construction as those described above.

In order to write information "0" into desired cells, the desired cells have been subjected to an ion implantation. In FIG. 3, one of the ion-implanted cells Clj is shown with a dotted circle as in the case of the prior art. However, the conduction type of the ions implanted into the channel regions of the desired cells, in contrast with the prior art, is opposite to that of the semiconductor substrate of the ROM. Therefore, in the N-channel FETs, the implanted ions are of N-type, such as phosphorus ions. After implanting ions of N-type impurities into the N-channel FETs having the silicon semiconductor substrate of P-type, the concentration of the P-type impurities in the implanted channel regions is lowered so that the ion-implanted cells are modified to depletion transistors having a lowered threshold voltage. The other cells, which have not been subjected to any ion implantation, remain enhancement-type transistors as in the prior art, but, in contrast to the prior art, represent the information "1". In the embodiment of FIG. 3, the threshold voltage of the enhancement-type transistors is plus 1 volt and that of the depletion-type transistors is minus 4 volts.

Figure 4:
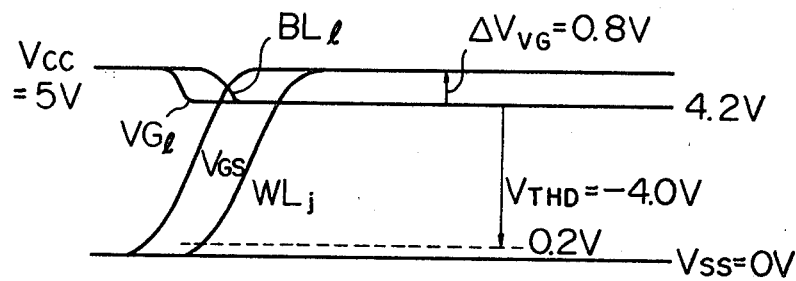
FIGS. 4 (*a*) and (*b*) are potential wave forms for explaining the operation of the circuit of FIG. 3.
Figure 4:
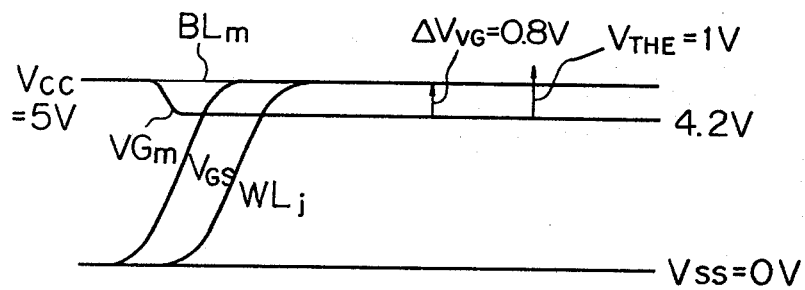

FIGS. 4 (a) and (b) are potential wave forms with respect to the cells Clj and Cmj respectively for explaining the operation of the circuit of FIG. 3.

During the reading out of data from the ROM designated in FIG. 3, all the bit lines BLl, BLm, . . . are connected to a power supply through a relatively large resistance (not shown) as in the prior art. Therefore, all the bit lines are maintained at a high level (Vcc=5 V) before applying a voltage to any one of the word lines. The transistors Q12 and Q22 are both in the off-state unless their respective gates receive a voltage $V_{GS}$, having a sufficient value to turn them on. Therefore, in this state, the potential voltages of the virtual ground lines VG'l, VG'm, . . . are the Vcc level.

Referring to FIG. 4 (a), when the data of the cell Clj, which has been subjected to N-type ion implantation, is to be read, the potential level of the virtual ground line VG'l, to which the cell Clj is connected, is lowered from the Vcc level to a lower level by applying the voltage $V_{GS}$ to the gate of the transistor Q12 connected to the same virtual ground line VG'l. The lowered level of the virtual ground line is determined by the ratio of the resistances of the transistors Q11 and Q12. The voltage drop $\Delta V_{VG}$ must be smaller than 1 V and is 0.8

V in this embodiment, and thus the lowered level of the virtual ground line is 4.2 V in this embodiment. After lowering the virtual ground level from 5 V to 4.2 V, a voltage of, for example, Vcc level is applied to the word line WLj. Instead of applying the 5 V to the word line, a voltage higher than 0.2 V and lower than 5.2 V may be applied to the word line. Since the threshold voltage of the cell CLj has been lowered and is minus 4 volts, and the potential level of the virtual ground line VG'l connected to the source of the cell Clj is 4.2 V as previously mentioned, the cell Clj is turned on when the potential level of the word line WLj connected to the gate of the cell Clj becomes higher than 0.2 V. When the cell Clj is turned on, the bit line BL1 is conducted to the virtual ground line VG'l so that the potential level of the bit line BL1 is lowered from 5 V to 4.2 V. Thus, the information "0" stored in the cell Clj can be read out by detecting the change of the level on the bit line BL1 using a sense amplifier (not shown) connected to the bit line BL1. In contrast to the prior art, since the implanted ions are an opposite type to the substrate, the depletion layer of the cell subjected to the ion implantation is expanded so that the junction capacitance of the ion implanted cell Clj becomes smaller than that of any enhancement-type cell. Because of the small junction capacitance of the drain and the source, the fall time of the bit line BL1 as well as that of virtual ground line VG'l is shorter than that in the prior art.

Referring to FIG. 4 (b), when the data of the cell Cmj, which has not been subjected to any ion implantation, is to be read, the potential level of the virtual ground line VG'm is lowered from the Vcc level to 4.2 V by applying the voltage $V_{GS}$ to the gate of the transistor Q22. Then, the potential level of the word line WLj is changed from 0 volt to 5 volt as in the case of reading the data of the cell Clj. The potential wave forms of $V_{GS}$ and WLj in FIG. 4 (b) are similar to those in FIG. 4 (a). However, in contrast to the case in FIG. 4 (a), since the threshold voltage of the enhancement-type cell Cmj is 1 V, the cell Cmj can not be turned on even when the potential level of the word line WLj reaches 5 V. That is, when the potential level of the word line is 5 V, the potential difference between the gate connected to the word line WLj and the source connected to the virtual ground line VG'm is only 0.8 V in this embodiment and not greater than the threshold voltage of 1 V. Therefore, the bit line BLm is not lowered to the virtual ground level but remains at the Vcc level. Thus, the information "1" stored in the cell Cmj can be read out by detecting the unchanged Vcc level on the bit line BLm using a sense amplifier (not shown) connected to the bit line BLm.

The other memory cells can also be read out in the same way as described above.

It can be concluded from the above description of reading out data from the ROM of the present invention, that it is sufficient to satisfy the following relations:

$$V_{THE} > (V_{WL} - V_{VG}) > V_{THD} \quad (1)$$

$$V'_{WL} - V_{VG} < V_{THD} < 0 \quad (2)$$

where $V_{THE}$ represents the threshold voltage of the enhancement-type cells, $V_{WL}$ represents the potential voltage of a selected word line to which the cell being read is connected, $V_{VG}$ represents the potential voltage of a selected virtual ground line, $V'_{WL}$ represents the potential voltage of a nonselected word line, and $V_{THD}$ represents the threshold voltage of the depletion-type cells. Formula (1) means that any enhancement-type cell must not be turned on even when it is read and any depletion-type cell must be turned on when the depletion-type cell is read. Formula (2) means that any depletion-type cell which is not read must not be turned on.

Figure 5:
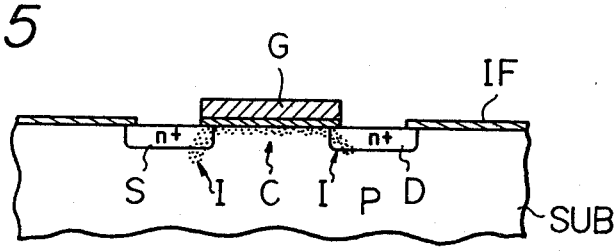
FIG. 5 is a partial cross-sectional view of one embodiment of the ROM according to the present invention.

Referring to FIG. 5, a partial cross-sectional view of a depletion-type memory cell in the ROM of the FIG. 3 is illustrated. As illustrated in FIG. 5, the source region S and the drain region D are formed at the surface of the substrate SUB. The surface of the substrate SUB is covered by an insulating film IF. A gate electrode G is formed on a part of the insulating film under which a channel region C between the source and the drain is formed during the conductive state. The ion implantation is performed at the surface of the gate G. The ions for implantation have a sufficient energy so as to be implanted into the surface of the substrate through the gate and the insulating film under the gate. The implanted region is mainly the channel region C between the source and the drain. However, the implantation of ions extends to an area the size of the mask used for ion implantation, and therefore, the implanted region is slightly larger than the channel region C. The above-mentioned ions having sufficient energy can therefore reach also the regions I in the substrate under the source or the drain through the source or the drain region. Due to the ions implanted into the regions I, the concentration of impurities in the junction between the substrate and the source or the drain is altered. In this embodiment of the present invention, the ions for implantation are of N-type which is opposite to the conduction type of the substrate. Therefore, the concentration of impurities in the junction is lowered resulting in the expansion of the depletion layer. Thus, a decreased junction capacitance and an increased junction breakdown voltage of the cell can be obtained. Of course, the amount of ions implanted into the substrate must not be so great that the conduction type of the substrate is inverted.

From the foregoing description, it will be understood that, according to the present inveniton, a mask ROM, having a higher operating speed due to decreased junction capacitance between the substrate and the source or the drain, having the capability of applying a higher voltage to the bit lines due to increased breakdown voltage between the substrate and the source or the drain, and also having the advantage of small size and short fabrication term due to an ion implantation method, can be obtained.

It should be noted that the voltage levels of the bit lines, word lines, and virtual ground lines are not limited to the values in the foregoing description of the embodiment, but may be other values so long as formulas (1) and (2) mentioned before are satisfied. Further, although N-channel transistors are employed in the ROM of the above-mentioned embodiment, alternatively, P-channel transistors may also be employed in a ROM of the present invention. When the cells in the ROM are P-channel transistors, the ions implanted into the substrate having N-type conductivity must be of P-type. The operating conditions in this case are:

$$V_{THE} < (V_{VG} - V_{WL}) < V_{THD} \quad (3)$$

$$(V'_{WL} - V_{VG}) > V_{THD} > 0 \quad (4)$$

where the notations $T_{THE}$, $V_{VG}$, $V_{WL}$, $V'_{WL}$ and $V_{THD}$ are as described before.

It will be apparent that many modifications and variations may be effected without departing from the scope of the novel concepts of this invention.

What we claim is:

1. A read only memory comprising:
   a plurality of word lines,
   a plurality of bit lines disposed relatively to said plurality of word lines to define a plurality of intersections therebetween,
   a plurality of virtual ground lines respectively corresponding to said plurality of bit lines, and
   a plurality of memory cells comprising field effect transistors, each located at a corresponding intersection of a respectively associated word line and a respectively associated bit line,
   each of said transistors having a first electrode connected to said respectively associated word line, a second electrode connected to said respectively associated bit line, and a third electrode connected to said virtual ground line respectively corresponding to said respectively associated bit line,
   each of said bit lines having plural said memory cells associated therewith, the plural said field effect transistors comprising said memory cells being connected in parallel between the associated said bit line and the respectively corresponding virtual ground line,
   particular ones of said memory cells, selected according to data to be stored in said read only memory, comprising depletion-type field effect transistors formed selectively by ion implantation and the remainder of said memory cells comprising enhancement-type cells not subjected to ion implantation, and
   means for selectively activating said word lines and said virtual ground lines to establish a first potential difference between a selected word line and the virtual ground line corresponding to a selected bit line which, as applied to the correspoding memory cell at the intersection of the selected word and bit lines, is sufficient to turn on said corresponding memory cell when comprising a depletion-type transistor but is insufficient to turn on said corresponding memory cell when comprising an enhancement-type transistor, and to establish a second potential difference between each non-selected word line and the virtual ground line corresponding to the said selected bit line which, as applied to the corresponding memory cells at the intersections of said non-selected word lines and said selected bit line, is insufficient to turn on said corresponding memory cells when comprising either a depletion-type transistor or an enhancement-type transistor.

2. A read only memory cell as claimed in claim 1, wherein said field-effect transistors are of N-channel type and said first electrode is a gate electrode, said second electrode is a drain electrode, and said third electrode is a source electrode.

3. A read only memory as claimed in claim 2, wherein said word lines and said virtual ground lines are activated so as to satisfy, with respect to memory cells on a selected bit line, relations as follows: $V_{THE} >$ [(potential of the selected word line) − (potential of the selected virtual ground line)] $> V_{THD}$, and [(potential of the nonselected word line) − (potential of the selected virtual ground line)] $< V_{THD} < 0$, where $V_{THE}$ is the threshold voltage of the enhancement-type memory cells, which have not been subjected to said ion implantation, and $V_{THD}$ is the threshold voltage of the depletion-type memory cells, which have been subjected to said ion implantation.

4. A read only memory as claimed in claim 2, wherein said ion implantation is effected with N-type impurities, so that the threshold voltage of said depletion-type memory cells is lowered.

5. The device of claim 1, 2, 3, or 4, operatively connected to a power supply and a ground, further comprising:
   resistance means connected between each of said virtual ground lines and ground.

6. A read only memory as claimed in claim 1, wherein said field-effect transistors are of P-channel type and said first electrode is a gate electrode, said second electrode is a source electrode, and said third electrode is a drain electrode.

7. A read only memory as claimed in claim 6, wherein said ion implantation is effected with P-type impurities, so that the threshold voltage of said particular memory cells is lowered.

8. A read only memory as claimed in claim 6, wherein said word lines and said virtual ground lines are activated so as to satisfy, with respect to memory cells on a selected bit line, the relations: $V_{THE} <$ [(potential of the selected virtual ground line) − (potential of the selected word line)] $< V_{THD}$, and [(potential of the nonselected word line) − (potential of the selected virtual ground line] $< T_{THD} < 0$, where $V_{THE}$ is the threshold voltage of said enhancement-type memory cells which have not been subjected to said ion implantation, and $V_{THD}$ is the threshold voltage of said depletion-type memory cells which have been subjected to said ion implantation.

9. The device of claim 5, wherein said resistance means comprises a field effect transistor.

10. The device of claim 1, 2, 4, 3, 6, 7, or 8, operatively connected to a power supply and a ground, further comprising:
    resistance means connected between each of said virtual ground lines and the power supply.

11. The device of claim 10, wherein said resistance means comprises a field effect transistor.

12. A method for initially writing data into a ROM having a plurality of MOSFET memory cells on a semiconductor substrate arranged at corresponding intersections of plural word and bit lines and having plural virtual ground lines respectively corresponding to said plural bit lines with said memory cells common to a given bit line connected in parallel between the common said bit line and the corresponding virtual ground line, by altering selected said memory cells from enhancement-type to depletion-type, comprising the steps of:
    providing a ROM having a plurality of MOSFET memory cells on a semiconductor substrate, each cell comprising a gate, an insulating film thereunder, and a channel region; and
    bombarding said respective channel regions of selected said MOSFET memory cells with ions of a conduction type opposite to that of the semiconductor substrate;
    said ions being of sufficient energy to substantially penetrate the gate and the insulating film under the gate of the selected memory cells and of a quantity which is sufficient to convert each said selected MOSFET memory cell to depletion-type.

13. The method of claim 12, wherein:

said bombarding step applied said ions in a quantity which is not sufficient to invert the conduction type of the semiconductor substrate.

14. The method of claim 13, applied to a ROM chip comprising P-channel memory cells, wherein:
said ions comprise a P-type impurity.

15. The product produced by the process of claim 14.

16. The method of claim 13, applied to a ROM chip comprising N-channel memory cells, wherein:
said ions comprise an N-type impurity.

17. The product produced by the process of claim 16.

18. A read only memory having a plurality of word lines, a plurality of bit lines extending transversely of said word lines and defining intersections therebetween, and a plurality of virtual ground lines respectively corresponding to said plurality of bit lines, and comprising:
a plurality of memory cells disposed at respectively corresponding said intersections,
each of said memory cells comprising a field effect transistor having a first electrode connected to a respectively associated said word line, a second electrode connected to a respectively associated said bit line, and a third electrode connected to the virtual ground line respectively corresponding to the respectively associated bit line,
said memory cells storing data in accordance with selective conversion of appropriate ones of said field effect transistors to depletion-type transistors by ion implantation and the remainder of said field effect transistors comprising enhancement-type transistors, said converted, depletion-type transistors having a reduced threshold voltage for operation relative to that of said enhancement-type transistors, and
means for selectively applying activating potentials to a selected word line and to the virtual ground line corresponding to a selected bit line defining an intersection with the selected word line corresponding to a given memory cell to be read out, for establishing a potential difference between said intersecting word line and corresponding virtual ground line which, as applied to the field effect transistor comprising said memory cells, is between the threshold voltage of said enhancement-type transistors and the threshold voltage of said depletion-type transistors.

19. A memory as recited in claim 18, further comprising:
means for sensing the voltage level of each said bit line, in accordance with its association with each said memory cell selected for rear out.

* * * * *

UNITED STATES PATENT AND TRADEMARK OFFICE
CERTIFICATE OF CORRECTION

PATENT NO. : 4,333,164

DATED : June 1, 1982

INVENTOR(S) : Orikabe et al.

It is certified that error appears in the above-identified patent and that said Letters Patent is hereby corrected as shown below:

Front page, [56] after "Primary Examiner-James W. Moffitt" insert --Attorney, Agent or Firm-Staas & Halsey--;

Fig. 1, label --PRIOR ART--;

Fig. 2, label --PRIOR ART--;

Fig. 3, "VG$\ell$ should be --VG'$\ell$--;

"VGm" should be --VG'm--;

Fig. 4, "VG$\ell$" should be --VG'$\ell$--;

"VGm" should be --VG'm--;

Col. 1, line 28, "a" should be --the--;

line 63, after "body" insert --,--;

Col. 3, line 54, after "drain" insert --,--;

Col. 5, line 8, "CLj" should be --Clj--;

Col. 6, line 47, "advantage" should be --advantages--;

UNITED STATES PATENT AND TRADEMARK OFFICE
CERTIFICATE OF CORRECTION

PATENT NO. : 4,333,164  Page 2 of 2

DATED : June 1, 1982

INVENTOR(S) : Orikabe et al.

It is certified that error appears in the above-identified patent and that said Letters Patent is hereby corrected as shown below:

Col. 8, line 37, "4, 3," should be --3, 4,--;

Col. 9, line 1, "applied" should be --applies--;

Col. 10, line 26, "rear" should be --read--.

Signed and Sealed this

Twenty-eighth Day of December 1982

[SEAL]

Attest:

GERALD J. MOSSINGHOFF

Attesting Officer   Commissioner of Patents and Trademarks